(12) United States Patent
Abe et al.

(10) Patent No.: US 6,708,264 B1
(45) Date of Patent: Mar. 16, 2004

(54) SYNCHRONOUS MEMORY DEVICE WITH PREFETCH ADDRESS COUNTER

(75) Inventors: Katsumi Abe, Yokohama (JP); Hiroyuki Ohtake, Tokyo (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 736 days.

(21) Appl. No.: 09/594,120

(22) Filed: Jun. 14, 2000

(30) Foreign Application Priority Data

Jun. 15, 1999 (JP) ............................................ 11-168615

(51) Int. Cl.⁷ .............................................. G06F 12/02
(52) U.S. Cl. .................. 711/169; 711/219; 365/230.04; 365/239
(58) Field of Search ................................ 711/169, 167, 711/218, 219, 154, 105, 202; 365/236, 238.5, 239, 230.04, 233, 189.02, 230.09, 189.05, 189.12; 712/36; 714/30

(56) References Cited

U.S. PATENT DOCUMENTS 5,047,975 A * 9/1991 Patti et al. .................. 708/706
5,831,926 A * 11/1998 Norris et al. .................. 711/5
6,215,729 B1 * 4/2001 Merritt ........................ 365/236
6,263,422 B1 * 7/2001 Wise et al. .................. 712/209

FOREIGN PATENT DOCUMENTS

| EP | 0 136 414 A2 | * 4/1985 | ............ G11C/8/00 |
| JP | 10-340579 | 12/1998 | |
| JP | 11-66878 | 3/1999 | |

* cited by examiner

*Primary Examiner*—Pierre-Michel Bataille
(74) *Attorney, Agent, or Firm*—Finnegan, Henderson, Farabow, Garrett & Dunner, L.L.P.

(57) ABSTRACT

A synchronous memory device includes a prefetch address counter. The address counter is composed of an n number of one-bit counter circuits, an n number of adders to which the output signals of these counters are supplied respectively, and an adder control circuit for controlling each adder. A start address is externally supplied to each of the one-bit counter circuits, which in turn count up. When the addressing mode is the sequential mode and the start address is an odd address, each adder performs addition according to the state of the even control signal outputted from the adder control circuit. With the addition, the address outputted from each one-bit counter circuit is inverted, but otherwise the same signal as the address outputted from each one-bit counter circuit is outputted.

17 Claims, 13 Drawing Sheets

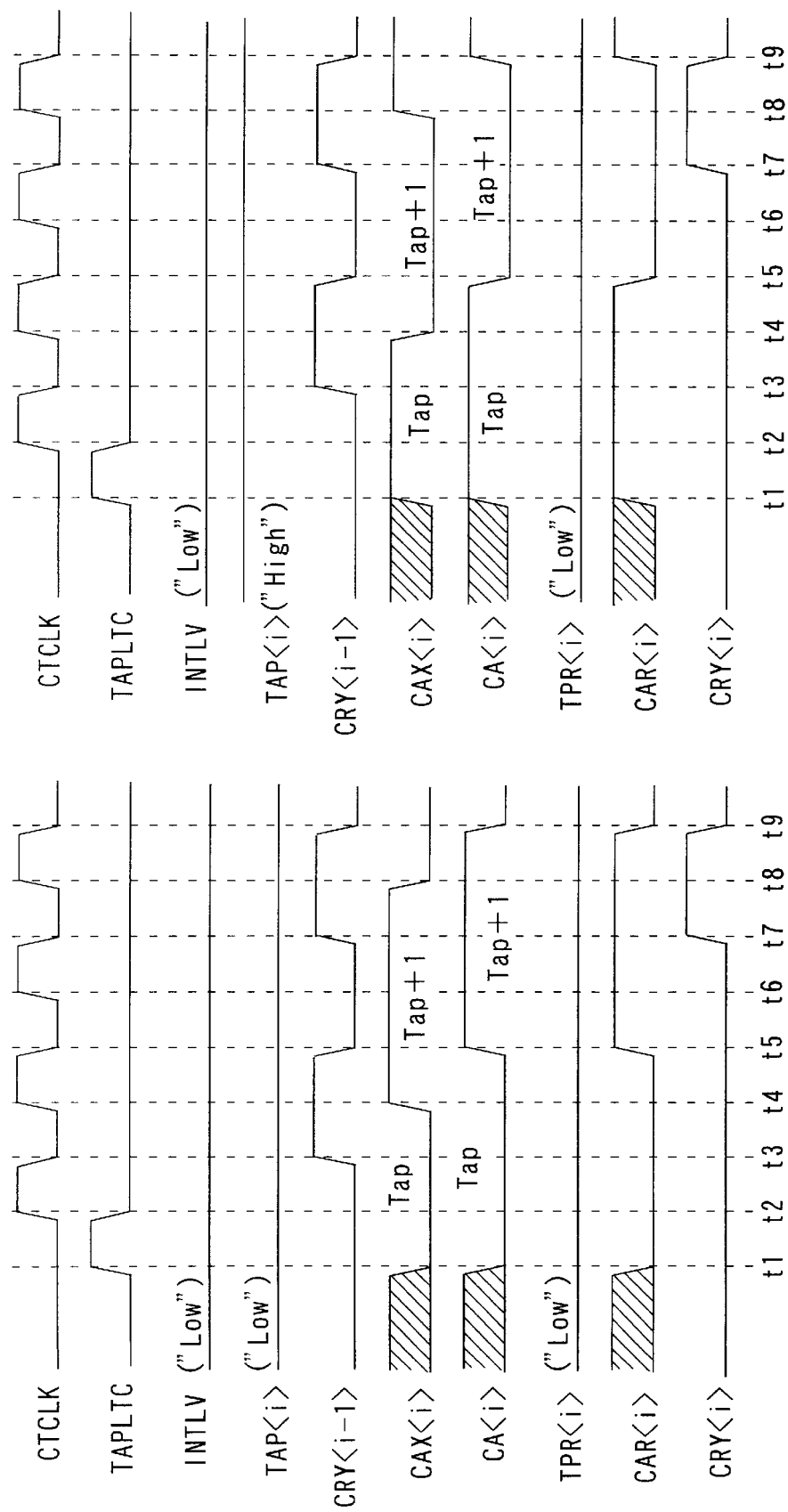

SYNCHRONOUS MEMORY DEVICE WITH PREFETCH ADDRESS COUNTER

CROSS-REFERENCE TO RELATED APPLICATIONS

This application is based upon and claims the benefit of priority from the prior Japanese Patent Application No. 11-168615, filed Jun. 15, 1999, the entire contents of which are incorporated herein by reference.

BACKGROUND OF THE INVENTION

This invention relates to a synchronous memory device using the techniques for accessing data items simultaneously in one cycle, or so-called prefetching techniques, and more particularly to the configuration of an address counter.

The recent trend of semiconductor memory technology has been toward using a DRAM with a special function for burst data transfer, such as a DRAM conforming to Rambus specifications or a synchronous DRAM (hereinafter, referred to as an SDRAM), in place of a conventional general-purpose DRAM in order to bridge the gap between the controller side including the CPU and MPU and the memory side. As for SDRAMs, Double Data Rate (DDR) specifications have been established and products conforming to the DDR specifications are going to be placed on the market. In the DDR specifications, not only the frequency of the basic clock (CLK) is raised, but also the input and output of data are synchronized with both of the leading edge and trailing edge of the basic clock as in a Rambus DRAM. In contrast, conventional Single Data Rate (SDR) specifications are such that the input and output of data are synchronized with the leading edge of the basic clock.

Now, consider the column accessing operation in a SDRAM. If the frequency of the basic clock is 100 megahertz, its period is 10 nanoseconds. In the case of SDR, the counting up of the address, column selection, and data transfer have to be performed in the 10-nanosecond period. Furthermore, when an attempt is made to increase the frequency of the basic clock or to carry out a DDR operation, a series of column access operations must be performed in the shortest time ranging from 3.5 to 4 nanoseconds. Even if a pipeline operation were performed or the manufacturing process of semiconductor devices were improved, the column accessing operation in such a short time would a very severe condition very difficult to satisfy using the present technology. Considering the fact that the CAS cycle time (tPC) of a conventional DRAM is about 12 to 15 nanoseconds, it is extremely difficult to realize such a short column accessing operation.

To solve this problem, a technique called prefetching has been introduced recently.

Semiconductor memory devices using the prefetching techniques have been disclosed in, for example, Jpn. Pat. Appln. KOKAI Publication No. 10-340579 and Jpn. Pat. Appln. KOKAI Publication No. 11-66878.

In the SDRAM, for example, when a column access operation is performed for reading, all the addresses to be accessed can be determined beforehand from the preset addressing mode and burst length at the time when the start address (hereinafter, referred to as the Tap address) supplied simultaneously with a read command is taken in. When the first Tap address is accessed, the subsequent addresses are accessed simultaneously, thereby reading part of the data, which gives a time margin to the column accessing operation of the second data item and later. Because a margin is given as CAS latency according to the SDRAM specifications to the time from when the read command is received until the data in the first Tap address is read, combining with a pipeline operation enables the data to be outputted continuously in a short cycle time. When too many bits have been prefetched, this makes timing control of the internal data lines complex. In addition, for example, a burst length smaller than the number of data items prefetched has been specified, the read-out data might be discarded uselessly. To avoid this, it is common practice to minimize the number of bits to be prefetched. From the viewpoint of the frequency of the present basic clock, two-bit prefetching has been considered to be able to cope with the cycle time sufficiently.

FIG. 1 is a block diagram of the address counter in a conventional semiconductor memory device without prefetching, which helps to explain the synchronous memory device. When the direction of depth of the column address is n+1 bits, the number of counters is n+1 from A<0> to A<n> (hereinafter, <n> represents an accompanying character for bit order and <m:n> indicates the consecutive bit orders from bit m to bit n, where m and n are integers). Signals ALTC<n:0>, CTCLK, TAPLTC, and INTLV are inputted to each of the counters 11-1 to 11-n. ALTC<n:0> is a Tap address latched inside and is inputted to the counters 11-0 to 11-n corresponding to the accompanying characters. CTCLK is a clock signal for incrementing the counter and TAPLTC is a signal for transferring the Tap address. INTLV is a signal indicating an addressing mode. When the signal is at the high level, this means an interleave mode. When it is at the low level, this means a sequential mode. The counters 11-0 to 11-n for the respective bits output a counter address CA<n:0> and at the same times a carry signal CRY<n−1:0> in such a manner that the counter address and carry signal are inputted to the counter at the next stage. At this time, the carry input to the counter 11-0 is fixed to a power supply (VDD) so that the counter may count up in each cycle. On the other hand, the carry of the counter 11-n is not outputted because there is no following stage.

FIG. 2 is a conceptual diagram showing the configuration of an address counter, which helps explain a conventional synchronous memory device that effects two-bit prefetching. To effect two-bit prefetching, two consecutive addresses are generally accessed and therefore two sets of counters 12A and 12B are needed. At the address input sections of the two sets of counters 12A and 12B, +1 adders 13A and 13B are provided, respectively. The output of an adder control circuit 14 determines which of the adders 13A and 13B is to be enabled.

Now, consider the operation of the adders 13A and 13B by reference to FIGS. 3A to 3D. In an SDRAM, two modes, the interleave mode and sequential mode, are defined as the addressing mode. FIGS. 3A and 3B show the interleave mode and FIGS. 3C and 3D show the sequential mode. In each mode, a total of four addressing patterns can be considered, depending on whether the Tap address is even (here, "0000") or odd (here, "001"). In FIGS. 3A to 3D, three-bit addressing is shown for the sake of simplification. In each counter cycle, an even address whose least significant bit is "0" is written separately from an odd address whose least significant bit is "1."

Two addresses written in one line (the part enclosed by a broken line) are assumed to be two-bit prefetched. In this case, the two sets of address counters 12A and 12B generate an even address and an odd address in each cycle, respectively. Of each counter set, the one-bit output corresponding to the low order is fixed to "0" or "1" and therefore is not needed. To effect three-bit addressing, the counter has only to contain two bits.

In the operation of the adders 13A and 13B in the interleave mode, when the Tap address is even (A<0>="0"), the address for the data to be read first is generated at the even counter and the address for the second data to be accessed simultaneously in two-bit prefetching is generated at the odd counter. At this time, because the counter address of the even counter is allowed to have the same value (000) as that of the Tap address, the adder on the even-number side need not operate and the Tap address has only to be transferred directly to the counter. The start address of the odd counter is such that the least significant bit is inverted in the Tap address (001). Since the least significant bit in the address has been fixed to "1" beforehand, the adder need not be operated and the remaining bits in the Tap address excluding the least significant bit have only to be transferred to the odd counter.

On the other hand, when the Tap address is odd (A<0>= "1"), the address for the data to be read first is generated at the odd counter and the address for the second data is generated at the even counter. At this time, because the counter address of the odd counter is allowed to have the same value (001) as that of the Tap address, the adder on the odd-number side need not operate and the Tap address has only to be transferred directly to the counter. The start address of the even counter is such that the least significant bit is inverted in the Tap address (000). Since the least significant bit in the odd counter has been fixed to "0," the adder need not be operated and the remaining bits in the Tap address excluding the least significant bit have only to be transferred to the even counter.

Next, consider the operation in the sequential mode. When the Tap address is even (A<0>="0"), the address for the data to be read first is generated at the even counter and the address for the second data is generated at the odd counter. At this time, because the counter address of the even counter is allowed to have the same value (000) as that of the Tap address, the adder on the even-number side need not operate and the Tap address has only to be transferred directly to the counter. The start address (001) of the odd counter is such that 1 is added to the Tap address. Since the least significant bit in the odd address has been fixed to "1," the adder need not be operated and the remaining bits in the Tap address excluding the least significant bit have only to be transferred to the odd counter.

In contrast, when the Tap address is odd (A<0>="1"), the address for the data to be read first is generated at the odd counter and the address for the second data is generated at the even counter. At this time, because the counter address of the even counter is allowed to have the same value (001) as that of the Tap address, the adder on the odd-number side need not operate and the Tap address has only to be transferred directly to the counter. The start address (010) of the even counter is such that 1 is added to the Tap address. In this case, it is insufficient that the least significant bit in the even address has been fixed to "0" and therefore a judgment has to be made as to whether carry-over should be performed, checking all the bits in the Tap address. Therefore, in this case, the operation of the adder on the even-number side is needed.

It can be seen from the above-described operation that the adder on the odd-number side does not operate at all in the respective cases and therefore is unnecessary and the adder has only to be provided on the even-number side. It is only when the Tap address is odd in the sequential mode that the adder on the even-number side operates.

FIG. 4 is a conceptual diagram of a two-bit prefetch counter, taking into account what has explained above. There are two sets of counters for even numbers and odd numbers. The counter for the least significant bit in the bit number of each address is omitted and the hypothetical least significant bit address is fixed to either "0" or "1." At the address input section of an even counter 12B', there is provided a +1 adder 13B controlled by the adder control circuit 14. The adder 13B operates in such a manner that, when the addressing mode is the sequential mode and the least significant bit in the Tap address is "1," the start address in the counter 12B' becomes Tap address+1.

FIG. 5 is a block diagram of a two-bit prefetch n-bit counter actually constructed on the basis of the conceptual diagram of FIG. 4. Two sets of counters for odd numbers and even numbers from A<1> to A<n> excluding A<0>, the least significant bit, are provided. The adder control circuit 14 senses that the sequential mode is on and the Tap address is odd and generates an odd control signal EvenCtrl<1:n> for each bit. The +1 adders 13B-1 to 13B-n are provided at the preceding stages of the odd counters 12B-1 to 12B-n and transfer the Tap address as it is or invert it (or add 1 to the Tap address) and transfer the inverted address.

Of the signals ALTC<n:0>, CTCLK, TAPLTC, and INTLV inputted to each circuit, ALTC<n:0> is the Tap address latched inside and is inputted to the counter with the corresponding accompanying character. The signal ALTC<0> of the least significant bit is inputted to the adder control circuit 14. CTCLK is a clock signal for incrementing the counters 12A-1 to 12A-n and 12B-1 to 12B-n and TAPLTC is a signal for transferring the Tap address to the inside of the counter. INTLV is a signal indicating the addressing mode. When this signal is high, this means the interleave mode. When the signal is low, this means the sequential mode.

The respective bits of the counters 12A-1 to 12A-n output odd counter addresses CAo<1:n> and the respective bits of the counters 12B-1 to 12B-n output even counter addresses CAe<1:n>. At the same time, the counters 12A-1 to 12A-n and 12B-1 to 12B-n output carry signals CRYo<1:n−1> and CRYe<1:n−1>, respectively. The carry signals CRYo<1:n−1> and CRYe<1:n−1> are inputted sequentially to the counters at the next stages. The carry input to the counters 12A-1 and 12B-1 corresponding to A<1> is fixed to the power supply (VDD) so that the counters count up in each cycle. The counters 12A-n and 12B-n corresponding to A<n> do not output any carry because they has no subsequent stage.

An example of the configuration of each of the counters 12A-1 to 12A-n and 12B-1 to 12B-n is shown in FIG. 6. An example of the configuration of each of the +1 adders 13B-1 to 13B-n is shown in FIG. 7. An example of the configuration of the adder control circuit 14 is shown in FIG. 8.

As shown in FIG. 6, each of the counters 12A-1 to 12A-n and 12B-1 to 12B-n is composed of three sections: a counter section 15, a Tap input section 16, and a carry operation section 17. FIG. 6 focuses on the counter 12A-i (or 12B-i) at the i-th (i−1 to n) stage. The counter section 15 includes an exclusive OR gate 21, clocked inverters 22 to 25, and inverters 26 and 27. The Tap input section 16 is composed of clocked inverters 28 and 29. The carry operation section 17 includes inverters 30 to 33, an NOR gate 34, an exclusive OR gate 35, and a NAND gate 36. A Tap loading signal TAPLTC is supplied to the inverter 37, which produces its inverted signal bTAPLTC. A clock signal CTCLK is supplied to the inverter 38, which produces its inverted signal bCTCLK.

According to the Tap loading signals TAPLTC, bTAPLTC, the Tap input section 16 loads the start address TAP into the counter section 15 and carry operation section 17. According the carry signal CRY<i-1> and clock signal CTCLK from the counter at the preceding stage, the counter section 15 counts up the counter address CA<i> sequentially. Furthermore, the carry operation section 17 generates a carry signal CRY<i> for controlling the timing with which the counter at the following stage counts up in the addressing mode.

As shown in FIG. 7, each of the +1 adders 13B-1 to 13B-n is composed of two CMOS transfer gates 39 and 40 and inverters 41 and 42. When signal EvenCtrl is at the low level, the adder outputs signal ALTC directly as signal TAP. When signal EvenCtrl is at the high level, the adder inverts signal ALTC and outputs the inverted signal as signal TAP.

Furthermore, as shown in FIG. 8, the adder control circuit 14 includes an inverter 43, NAND gates 44-1 to 44-n, and inverters 45-1 to 45-n. The adder control circuit 14 receives signal INTLV and Tap address and makes high the signals EvenCtrl all the way to the NAND gates where the Tap address in the individual bits inputted are all "1," with signal INTLV at the low level, or in the sequential mode. Naturally, the remaining signals EventCtrl are all at the high level.

In those configurations, the start address in each of the counters 12A-1 to 12A-n and 12B-1 to 12B-n will be explained. First, in the configuration of FIG. 5, since Tap address ALTC<1:n> is inputted directly to the odd counters 12A-1 to 12A-n, the start address is the same as the Tap address, regardless of the case. As for the even counters 12B-1 to 12B-n, when the addressing mode is the interleave mode, all the EvenCtrl signals of the adder control circuit 14 are at the low level, causing the transfer gates 39 for the adders 13B-1 to 13B-n to open, which allows the Tap address to become the start address without any change. When the addressing mode is the sequential mode, signal INTLV is low, which causes the adder control circuit 14 to decode the Tap address. If signal ALTC<0> is "0" (Tap address is odd), all the EvenCtrl signals are at the low level, allowing the Tap address to become the start address without any change as in the interleave mode. Moreover, when signal ALTC<0> is "1" (Tap address is odd), at least signal EvenCtrl<1> is at the high level and the bits in the signals EvenCtrl that go high according to the states of the higher-order bits change. For example, when signal ALTC<0:n> is 110 ... 0, signal EvenCtrl<1:2> is high and signal EvenCtrl <3:n> is low. Even control signal EvenCtrl<n> for the n-th bit is generally expressed by the following equation (1):

$$EvenCtrl<n>=/INTLV \cdot AILTC<0:n-1> \quad (1)$$

where signal /INTLV is the inverted signal of INTLV.

Therefore, the Tap address is inputted as it is to the even counters 12B-3 to 12B-n and the inverted one is inputted to the even counters 12B-1 and 12B-2. Specifically, the start address inputted to the even counters 12B-1 to 12B-n is 001 ... 0, which is the value obtained by adding 1 to the Tap address.

Next, the operation timing of the counters shown in FIG. 6 will be explained by reference to FIGS. 9A and 9B and FIGS. 10A and 10B. These timing charts help explain the operation of counter 12A-2 as a representative of the counters. As shown in FIGS. 3A to 3D, there are a total of four types of addressing.

FIGS. 9A and 9B show the operation timing in the sequential mode and FIGS. 10A and 10B show the operation timing in the interleave mode. Moreover, FIGS. 9A and 10A show the operation timing when TAP<i>="0." FIGS. 9B and 10B show the operation timing when TAP<i>="1."

First, FIGS. 9A and 9B will be described. When the addressing mode is the sequential mode, the operation of the carry operation section 17 is simple. Since signal INTLV is low, TPR<i> is fixed to the high level, causing the value of CAR<i> to be equal to that of CA<i>, regardless of the state of TAP<i>. When a column command is received and the Tap address is determined, signal TAPLTC goes high (from time t1 to time t2). Then, the counter section 15 takes in TAP<i>. At this time, because clock signal CTCLK is still low, the TAP<i> passes through CAX<i> and is outputted as it is to CA<i>. Next, even when signal TAPLTC goes low (at time t2) and clock signal CTCLK goes high, the value of CA<i> is loaded into the master stage again because carry signal CRY<i-1> from the preceding stage is low, with the result that the state of CAX<i> remains unchanged. Furthermore, when clock signal CTCLK goes low (at time t3), the value of CAX<i> is transferred. At this time, since CAX<i> remains unchanged, thus the value of CAX<i> remains unchanged. On the other hand, because carry signal CRY<i-1> from the counter at the preceding stage goes high at that time, as soon as clock signal CTCLK goes high at the next time t4, the value of CAX<i> is inverted. Furthermore, when clock signal CTCLK goes low at time t5, CA<i> is inverted. Hereinafter, similarly, at time t6, neither CAX<i> nor CA<i> changes. At time t7, carry signal CRY<i-1> goes high, permitting CAX<i> to be inverted at the next time t8. At time t9, CA<i> is inverted. From this time on, those operations are repeated, thereby causing the counter to count up.

The carry signal CRY<i> the counter outputs is equal to the AND of carry signal CRY<i-1> at the preceding stage and CA<i> because the value of CAR<i> is always equal to the value of CA<i>. As shown in FIG. 9A, when TAP<i>= "0," the carry signal CRY<i> is high from time t7 to time t9 during the time when both CA<i> and CRY<i-1> are high. Moreover, as shown in FIG. 9B, when TAP<i>="1," the carry signal CRY<i> is high from time t3 to time t5.

In the interleave mode shown in FIGS. 10A and 10B, the operation of the counter section is the same as in the sequential mode and therefore its explanation will be omitted. Only one thing that differs is the operation of the carry operation section 17. Specifically, since signal INTLV is high, the value of TPR<i> is equal to the value of TAP<i> taken in from time t1 to time t2. The EXOR (exclusive OR) (CAR<i> ) of the signal and counter address CA<i> is ANDed with CRY<i-1>. The resulting signal is a carry signal CRY<i>. Specifically, when CA<i> makes its round of TAP<i> and is inverted and the carry signal CRY<i-1> at the preceding stage goes high, a carry signal is outputted. Therefore, the CRY<i> is outputted from time t7 to time t9, regardless of whether TAP<i> is either "0" or "1."

Although a two-bit prefetch address counter can be constructed as described above, use of prefetching techniques to secure a margin for cycle time or access time makes it necessary to prepare as many bits as are needed to prefetch the sets of address counters as seen from FIG. 5. In an SDRAM, when the Full Page mode is considered, an address counter containing as many bits (e.g., 10 bits for 1000 columns) as correspond to the direction of depth of column address is needed, even if prefetching is not done. If two-bit prefetching is implemented, twice (e.g., 9 bits×2=18 for 1000 columns) as many address counters as correspond to the number of bits excluding the least significant bit are needed.

Although prefetching techniques have the merit of making the column access operation faster, such problems as an increase in the number of circuits or the circuit area arise. Since those address counters are generally shared in a single chip, it is desirable that they should be arranged in places at as equal distances from the respective banks as possible to equalize the delay time to each bank. Such places, however, are often very important area to the other principal circuits from the viewpoint of characteristics. Thus, placing many address counters is by no means favorable from the standpoint of the characteristics of the entire chip.

As described above, in the conventional synchronous memory device using prefetching techniques to cope with a high-frequency basic clock and highspeed data accessing according to DDR specifications, an increase in the number of circuits or the circuit area in the address counters has become a problem.

BRIEF SUMMARY OF THE INVENTION

It is, accordingly, an object of the present invention to provide a synchronous memory device which operates at high speed and is excellent in its operating characteristics.

Another object of the present invention is to provide a synchronous memory device capable of suppressing an increase in the number of circuits and the circuit area of the address counters even when using prefetching techniques, thereby reducing the chip area.

The foregoing objects are accomplished by providing a synchronous memory device with a prefetch address counter for accessing data items in a single cycle, the address counter comprising: an n number of one-bit counter circuits to each of which a start address supplied simultaneously with a read command, a clock signal for incrementing a count value, a signal for transferring the start address to the inside of the counter, and a signal indicating an addressing mode are supplied, and the first stage of which counts up in each cycle, thereby causing a carry signal to be inputted to the following stage one after another; an adder control circuit to which an addressing mode signal indicating the state of the addressing mode and the outputs of the n one-bit counter circuits are supplied and which senses that the addressing mode is the sequential mode and the start address is an odd address and generates an even control signal for each bit; and an n number of adders which are provided so as to correspond to the one-bit counter circuits and which, according to the state of the even control signal outputted from the adder control circuit, invert the address outputted from each of the one-bit counter circuits when the addressing mode is the sequential mode and the start address is an odd address, but otherwise output the same signal as the address outputted from each of the one-bit counter circuits, wherein the n one-bit counter circuits and the n adders output n-bit addresses.

With the above-described configuration, even when prefetching is used, the number of one-bit counters needed is n, which is half the number of one-bit counters needed for a conventional equivalent, or 2×n. Furthermore, since the conventional equivalent needed n+1 one-bit counters even when prefetching is no used, the number of one-bit counters is reduced by one. If the number of bits is small, a decrease in the circuit area as a result of a decrease in the number of one-bit counters is greater than an increase in the chip area as a result of providing adders. Therefore, it is possible to provide a synchronous memory device capable of decreasing the chip area by suppressing an increase in the number of address counter circuits and in the circuit area.

Furthermore, it is possible to provide a synchronous memory device which operates at high speed and is excellent in its operating characteristics as a result of effecting prefetching to cope with high-frequency basic clocks and high-speed data accessing according to, for example, DDR specifications.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 9A is a timing chart when TAP<i> is "0," which shows the operation of the counters in the sequential mode;

FIG. 9B is a timing chart when TAP<i> is "1," which shows the operation of the counters in the sequential mode;

DETAILED DESCRIPTION OF THE INVENTION

[First Embodiment]

Figure 4:
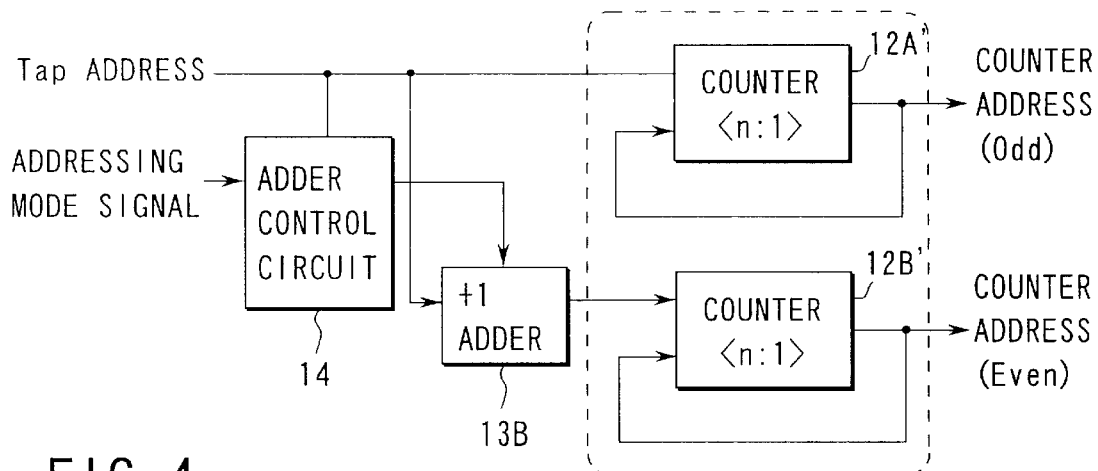
FIG. 4 is a conceptual diagram of a conventional improved two-bit prefetch counters.
Figure 11:
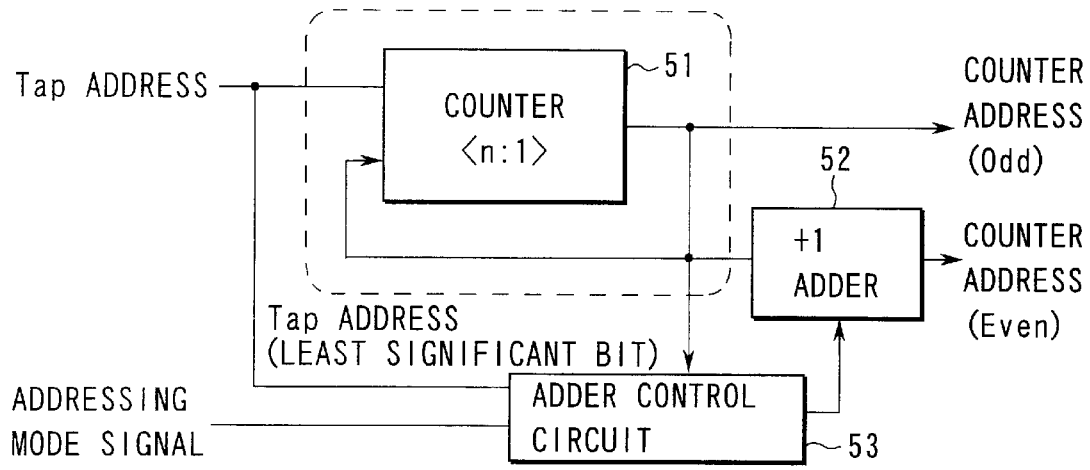
FIG. 11 is a conceptual diagram of an address counter in a semiconductor memory device using prefetching techniques, which helps explain a synchronous memory device according to a first embodiment of the present invention.

FIG. 11 is a conceptual diagram of an address counter in a semiconductor memory device using prefetching techniques, which helps explain a synchronous memory device according to a first embodiment of the present invention. In the first embodiment, it is assumed that two-bit prefetching is done. There is one counter set with the least significant bit counter removed. The Tap address excluding the least significant bit is inputted directly to the counter set, which creates an odd counter address. This part is the same as that for creating an odd address in the conventional counter of FIG. 4. An even address is created by doing calculations on an odd counter address by means of a +1 adder 52 controlled by an adder control circuit 53. The adder control circuit 53 controls the adder 52 on the basis of an addressing mode signal, the least significant bit in the Tap address for judging whether the Tap address is odd or even, and an odd counter address. Hereinafter, the operation of the adder 52 will be explained by reference to FIGS. 3A to 3D.

FIGS. 3A to 3D have shown that there are four addressing patters, depending on whether the addressing mode is the interleave mode or the sequential mode and whether the Tap address is odd or even. In a case where an even counter address and an odd counter address are viewed independently, each bit in the even address and odd address enclosed by a solid line is equal in any cycle, when the mode is the interleave mode, or when the mode is the sequential mode and the Tap address is even, with the low-order address CA<0> fixed to "0" and "1" being ignored only when the mode is the sequential mode and the Tap address is odd, the individual bits in an even address do not coincide with those in an odd address. An even address is therefore obtained by adding one to an odd address.

From this, it is seen that an even address can be created without a separate counter by causing the output of an odd counter to pass through a specific filter. The function of the filter is firstly to add +1 when the mode is the sequential mode and the Tap address is odd and secondly to output the same signal as that for an odd address in the other cases.

Figure 12:
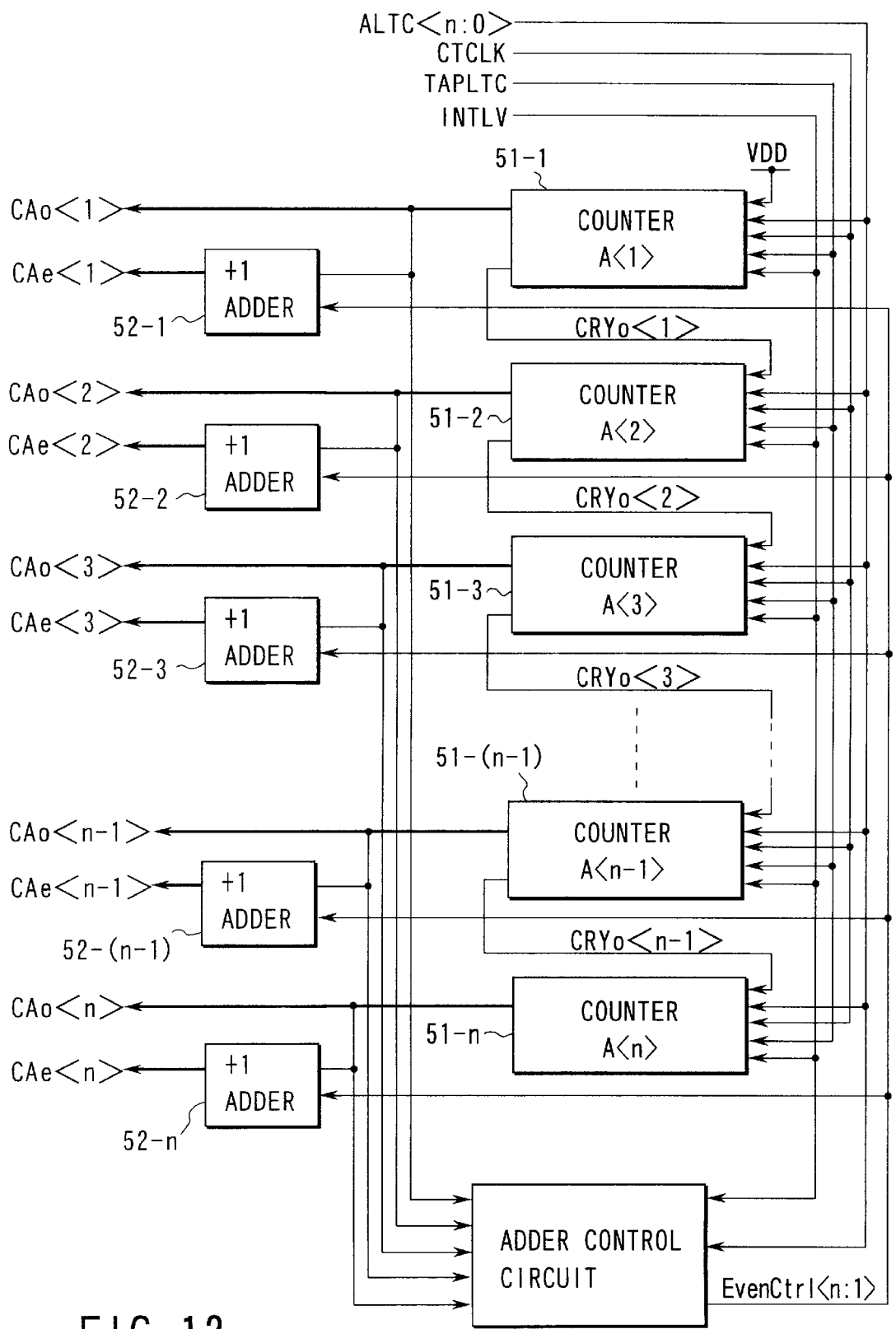
FIG. 12 is a circuit diagram showing a concrete example of the configuration of the two-bit prefetch counters in the synchronous memory device according to the first embodiment.

FIG. 12 is a block diagram of the first embodiment when a two-bit prefetch n-bit address counter is constructed, taking into account what has been described above. As for the counter body, there is provided a set of counters (one-bit counter circuits) 51-1 to 51-n for A<1> to A<n> excluding the least significant bit A<0>. The adder control circuit 53 senses that the Tap address is odd in the sequential mode and creates an even control signal EvenCtrl<1:n> for each bit. Furthermore, +1 adders 52-1 to 52-n are provided only at the preceding stages of the respective even counters. They transfer the Tap address as it is, or invert the Tap address (or add +1 to the address) according to the state of EvevCtrl<1:n>, and transfer the result.

Signals ALTC<n:0>, CTCLK, TAPLTC, and INTLV are inputted to each of the counters 51-1 to 51-n. ALTC<n:0> is a Tap address latched inside and is inputted to the counters 51-1 to 51-n corresponding to the accompanying characters and ALTC<0> is inputted to the adder control circuit 53. CTCLK is a clock signal for incrementing the counters 51-1 to 51-n and TAPLTC is a signal for transferring the Tap address to the inside of the counter. INTLV is a signal indicating an addressing mode. When the signal is at the high level, this means an interleave mode. When it is at the low level, this means a sequential mode. The counters 51-1 to 51-n for the respective bits output an odd counter address CAo<1:n> and a carry signal CRYo<1:n–1>. The carry signal CRYo<1:n–1> is inputted to the counter at the following stage one after another. At this time, the carry input to the counter 51-1 is fixed to a power supply (VDD) so that the counter may count up in each cycle. Since there is no following stage, the carry of the counter 51-n is not outputted.

Figure 6:
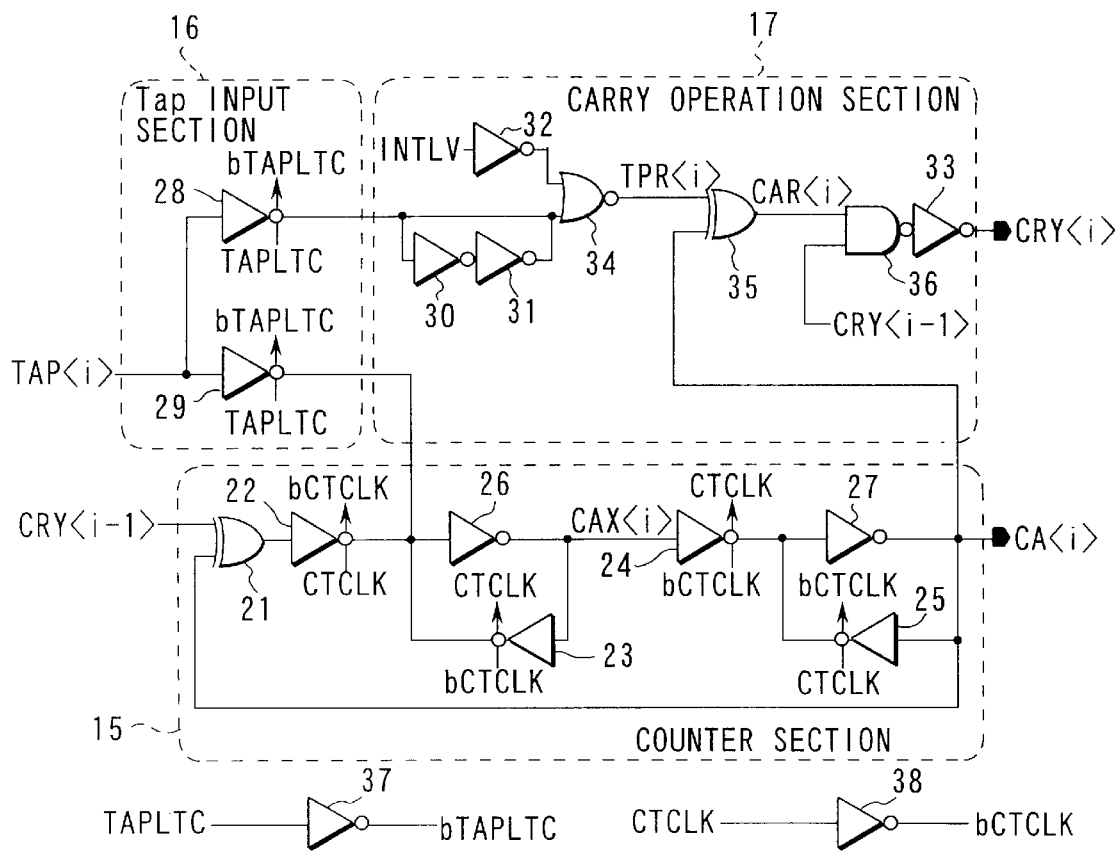
FIG. 6 is a circuit diagram showing an example of the configuration of each counter in the circuit of FIG. 5.
Figure 13:
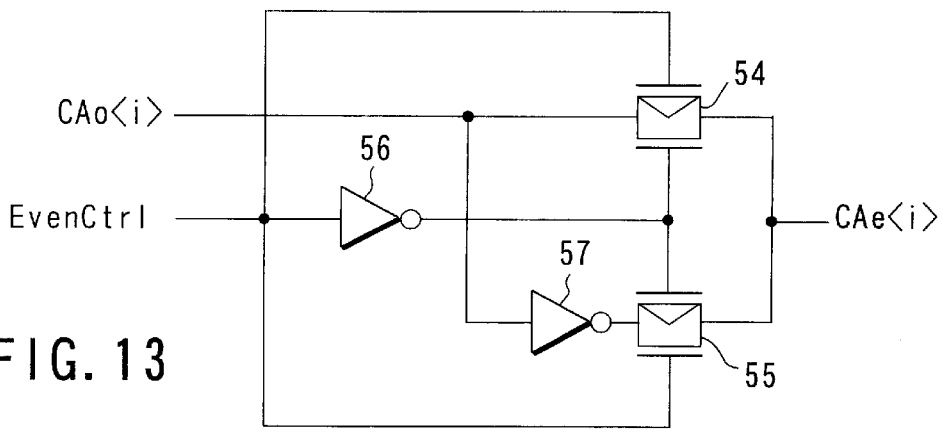
FIG. 13 is a circuit diagram showing an example of the configuration of the +1 adder circuit in the two-bit prefetch counters of FIG. 12.

With the above configuration, conventional counters can be applied to the counters 51-1 to 51-n, each of which can be constructed as shown in FIG. 6. Each of the +1 adders 52-1 to 52-n is composed of two CMOS transfer gates 54, 55 and two inverters 56, 57 as shown in FIG. 13. Signal EvenCtrl is supplied to each of the input terminal of the inverter 56, the gate of a p-channel MOS transistor constituting the transfer gate 54, and the gate of an n-channel MOS transistor constituting the transfer gate 55. The output signal of the inverter 56 is supplied to the gate of an n-channel MOS transistor constituting the transfer gate 54 and the gate of a p-channel MOS transistor constituting the transfer gate 55. Odd address CAo<i> (i=1 to n) is supplied not only to one end of the transfer gate 54 but also to one end of the transfer gage 55 via the inverter 57. Even address CAe<i> is outputted at the other end of each of the transfer gates 54, 55. When signal EvenCtrl is low, odd address CAo<i> is outputted directly as even address CAe<i>. When it is high, odd address CAo<i> is inverted and outputted as even address CAe<i>.

Figure 14:
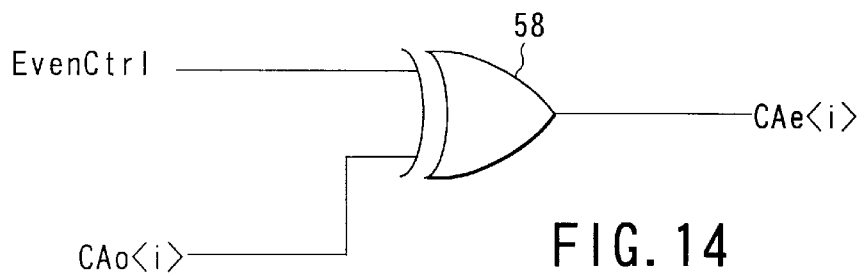
FIG. 14 is a circuit diagram showing another example of the configuration of the +1 adder circuit in the two-bit prefetch counters of FIG. 12.

Alternatively, each of the +1 adders 52-1 to 52-n may be constructed using an exclusive OR gate as shown in FIG. 14. In this case, the circuit configuration differs but the operation is the same. In a case where an exclusive OR gate 58 is used, when signal EvenCtrl is low, odd address CAo<i> is allowed to pass through as it is, and when it is high, the odd address is inverted and the inverted address is allowed to pass through. In this way, even address CAe<i> is created.

Figure 15:
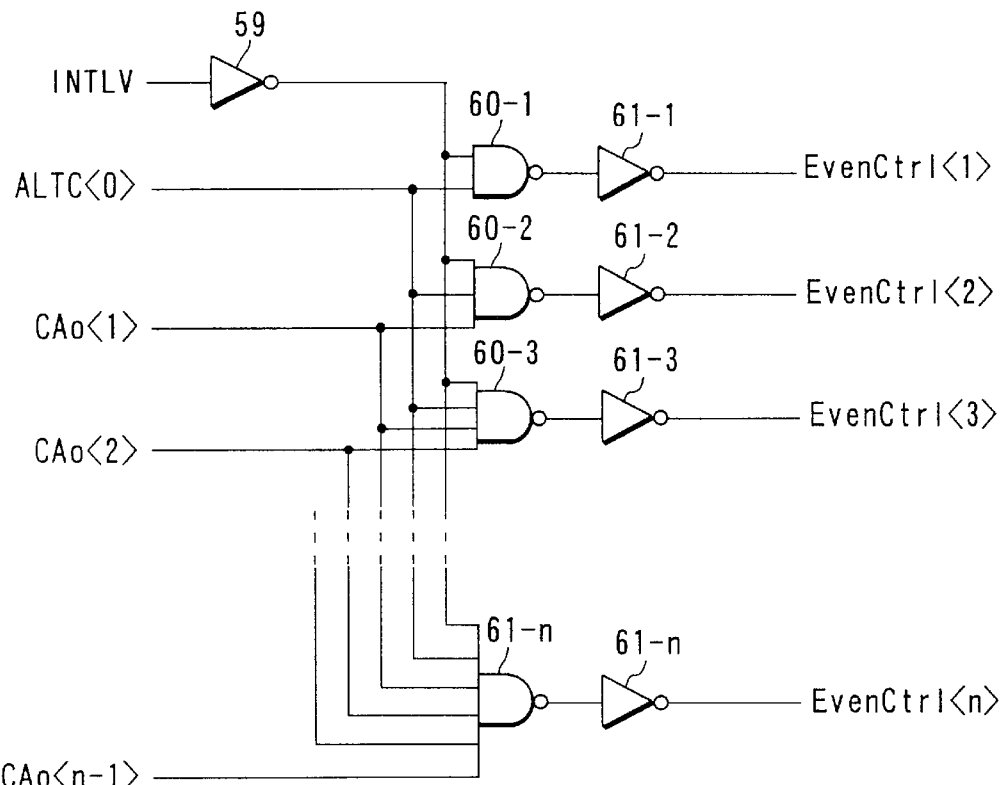
FIG. 15 is a circuit diagram showing an example of the configuration of the adder control circuit in the two-bit prefetch counters of FIG. 12.

Furthermore, the adder control circuit 53 is constructed as shown in, for example, FIG. 15. The adder control circuit 53 includes an inverter 59, NAND gates 60-1 to 60-n, and inverters 61-1 to 61-n. Signal INTLV indicating the addressing mode is supplied to the input terminal of the inverter 59. The output signal of the inverter 59 is supplied to each of the NAND gates 60-1 to 60-n. Signal ALTC<0>, the least significant bit in the Tap address, is supplied to each of the NAND gates 60-1 to 60-n. In addition to these signals, odd counter address CAo<1> is supplied to NAND gate 60-2. Besides these signals, odd counter address CAo<2> is supplied to NAND gate 60-3. Odd counter addresses CAo<3> to CAo<n-2> are supplied additionally to NAND gates 60-4 to 60-(n-1) at the following and later stages, respectively. Odd counter address CAo<n-1> is supplied additionally to NAND gate 60-n at the last stage. Then, the output signals of the NAND gates 60-1 to 60-n are supplied to the input terminals of the inverters 61-1 to 61-n, respectively. Even control signal EvenCtrl<1> to EvenCtrl<n> are outputted at the output terminals of the inverters 61-1 to 61-n.

With the above configuration, when signal INTLV is low and ALTC<0>, the least significant bit in the Tap address, is high, that is, when the Tap address is odd in the sequential mode, each odd counter address is decoded. For example, when signal INTLV is low and signal ALTC<0> is high, if odd counter address CAo<1:n> is 10 . . . 0 in a certain cycle, EvenCtrl<1:n>, the output of the adder control circuit 53, is 11 . . . 0. Therefore, even address CAe<1:n> becomes 01 . . . 0, the value obtained by adding one to an odd address. From what has been explained, odd control signal EvenCtrl<n> for the n-th bit is expressed by the following logical equation (2):

$$\text{EvenCtrl}<n>=/\text{INTLV}\cdot\text{AILTC}<0>\cdot\text{CA}<1:n-1> \quad (2)$$

where signal /INTLV is the inverted signal of INTLV.

Figure 1:
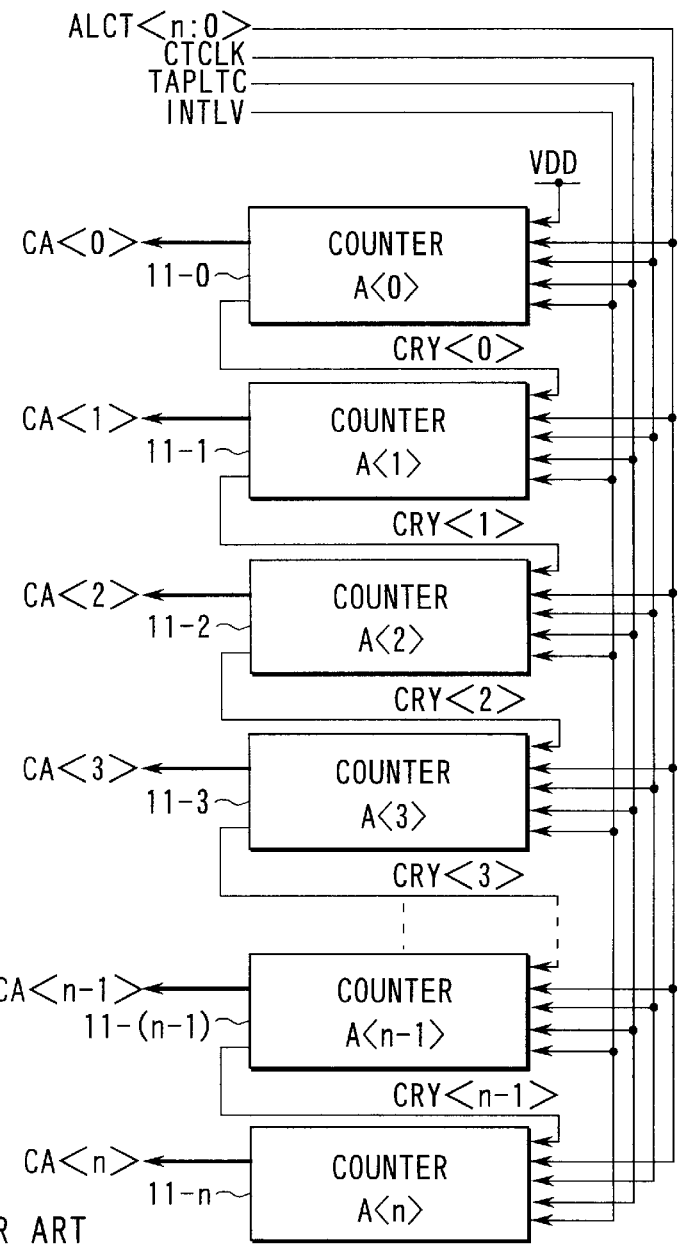
FIG. 1 is a block diagram of the address counters extracted from a conventional semiconductor memory device without prefetching, which helps explain the synchronous memory device.
Figure 2:
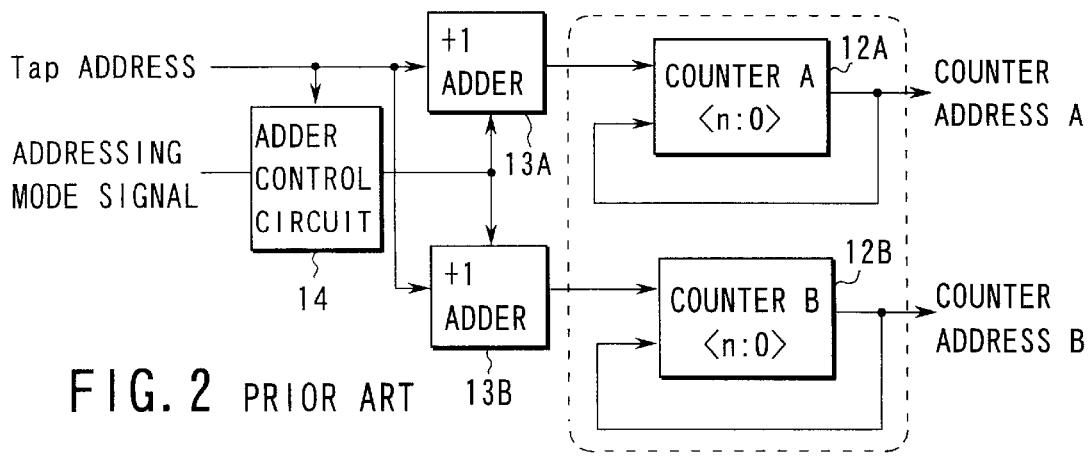
FIG. 2 is a conceptual diagram showing the configuration of the address counters, which helps explain a synchronous memory device with two-bit prefetching.
Figure 3A:
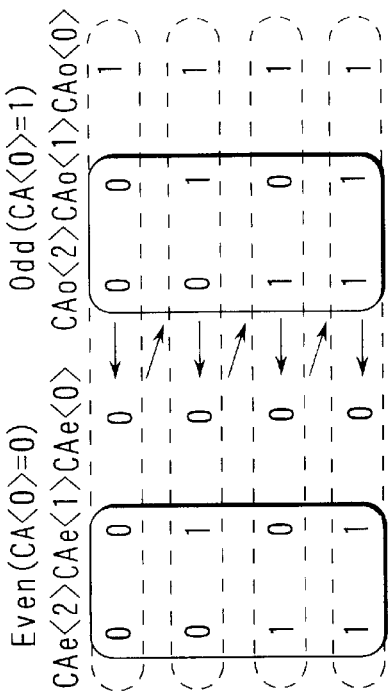
FIGS. 3A and 3B are diagrams showing an interleave operation, which helps explain the transition of addresses in two-bit prefetching.
Figure 3C:
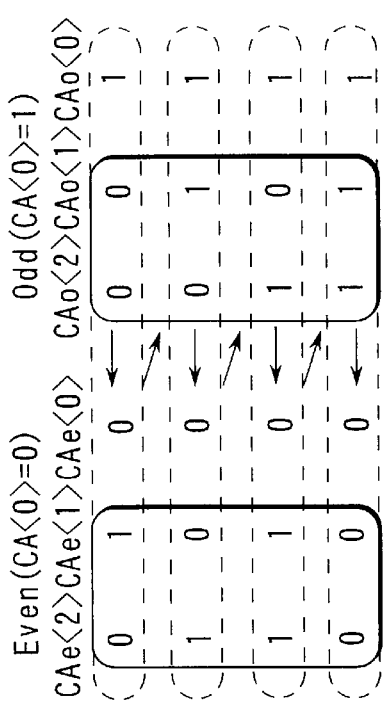
FIGS. 3C and 3D are diagrams showing a sequential operation, which helps explain the transition of addresses in two-bit prefetching.
Figure 3B:
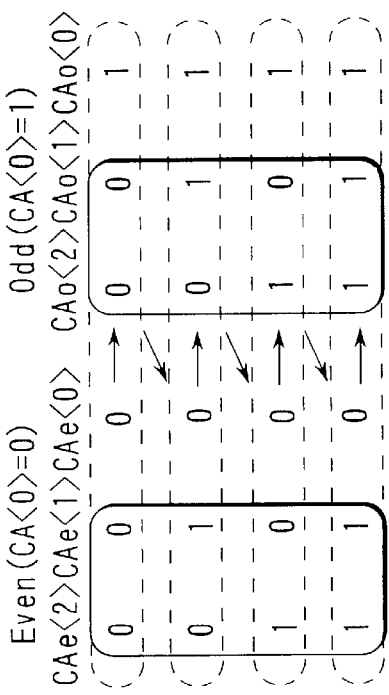
Figure 3D:
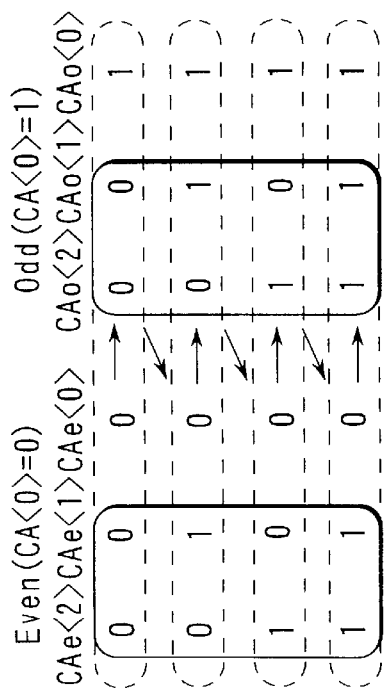
Figure 5:
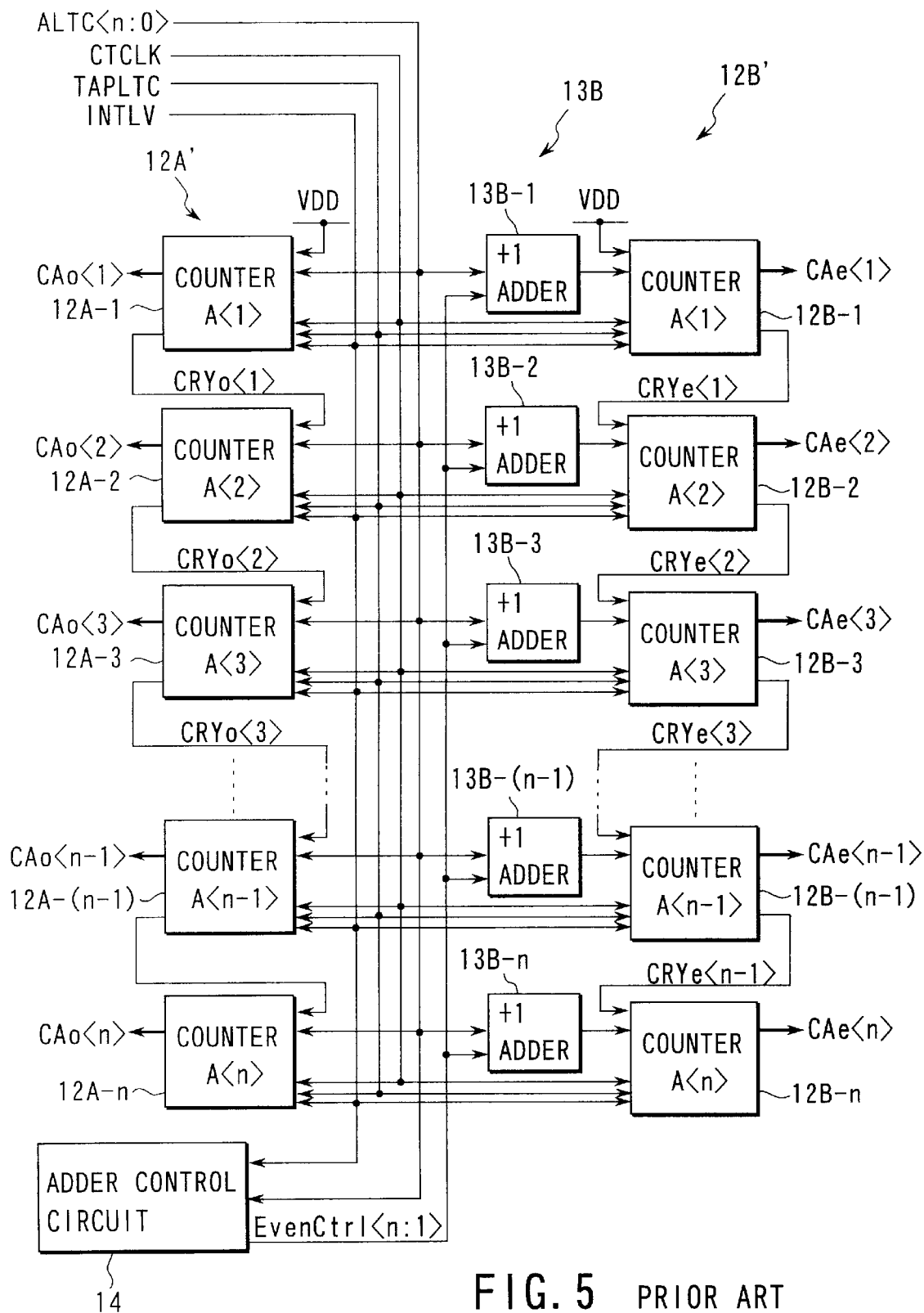
FIG. 5 is a block diagram showing an example of the configuration of the two-bit prefetch counters shown in FIG. 4.
Figure 7:
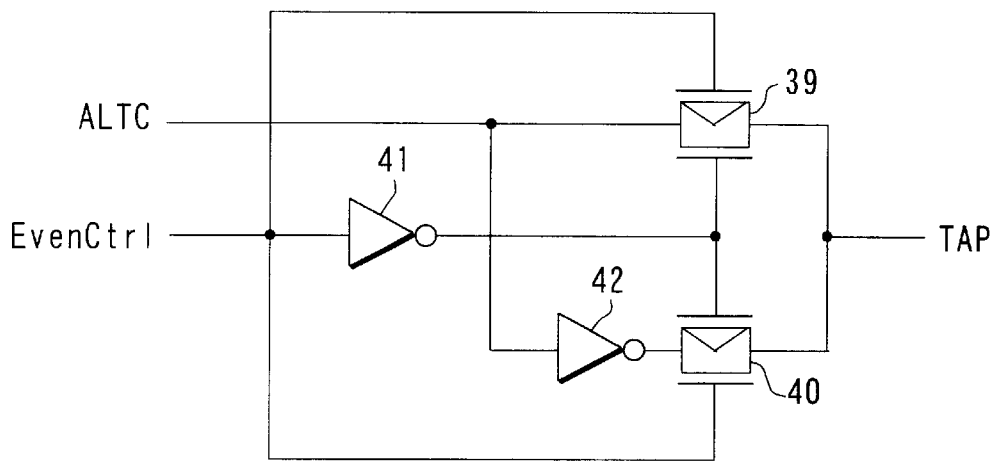
FIG. 7 is a circuit diagram showing an example of the configuration of the +1 adder in the circuit of FIG. 5.
Figure 8:
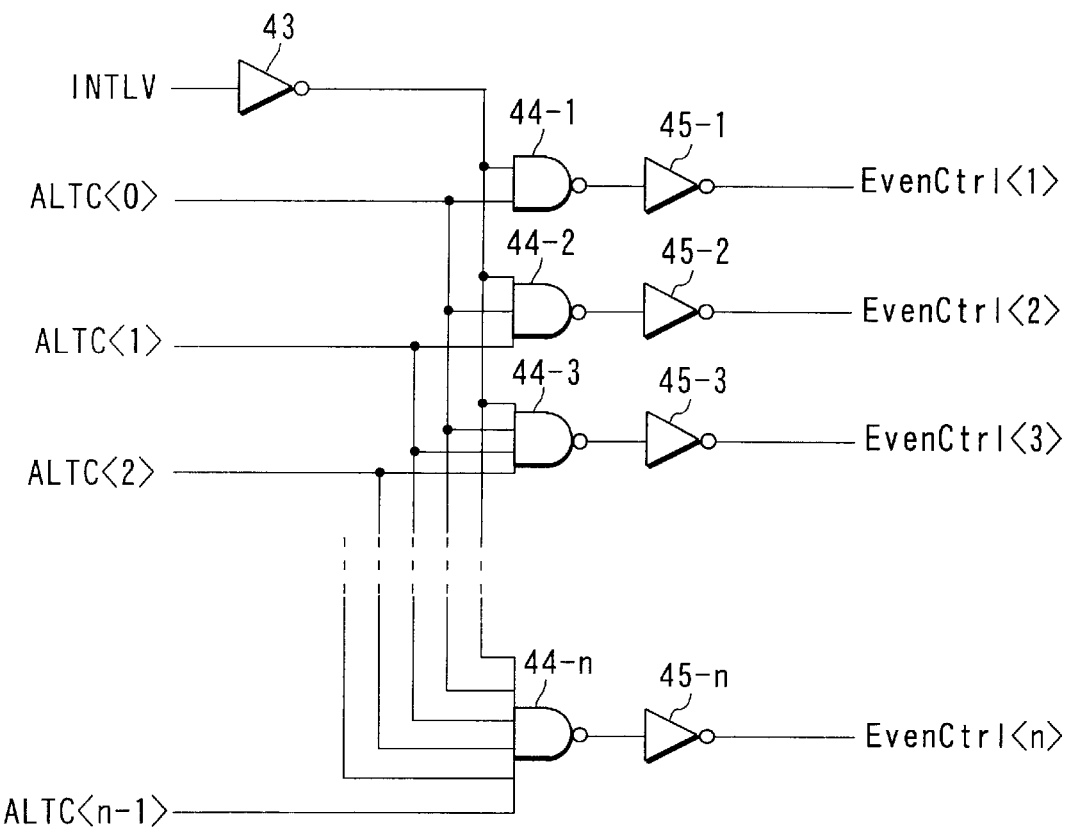
FIG. 8 is a circuit diagram showing an example of the configuration of the adder control circuit in the circuit of FIG. 5.
Figures 10A, 10B:
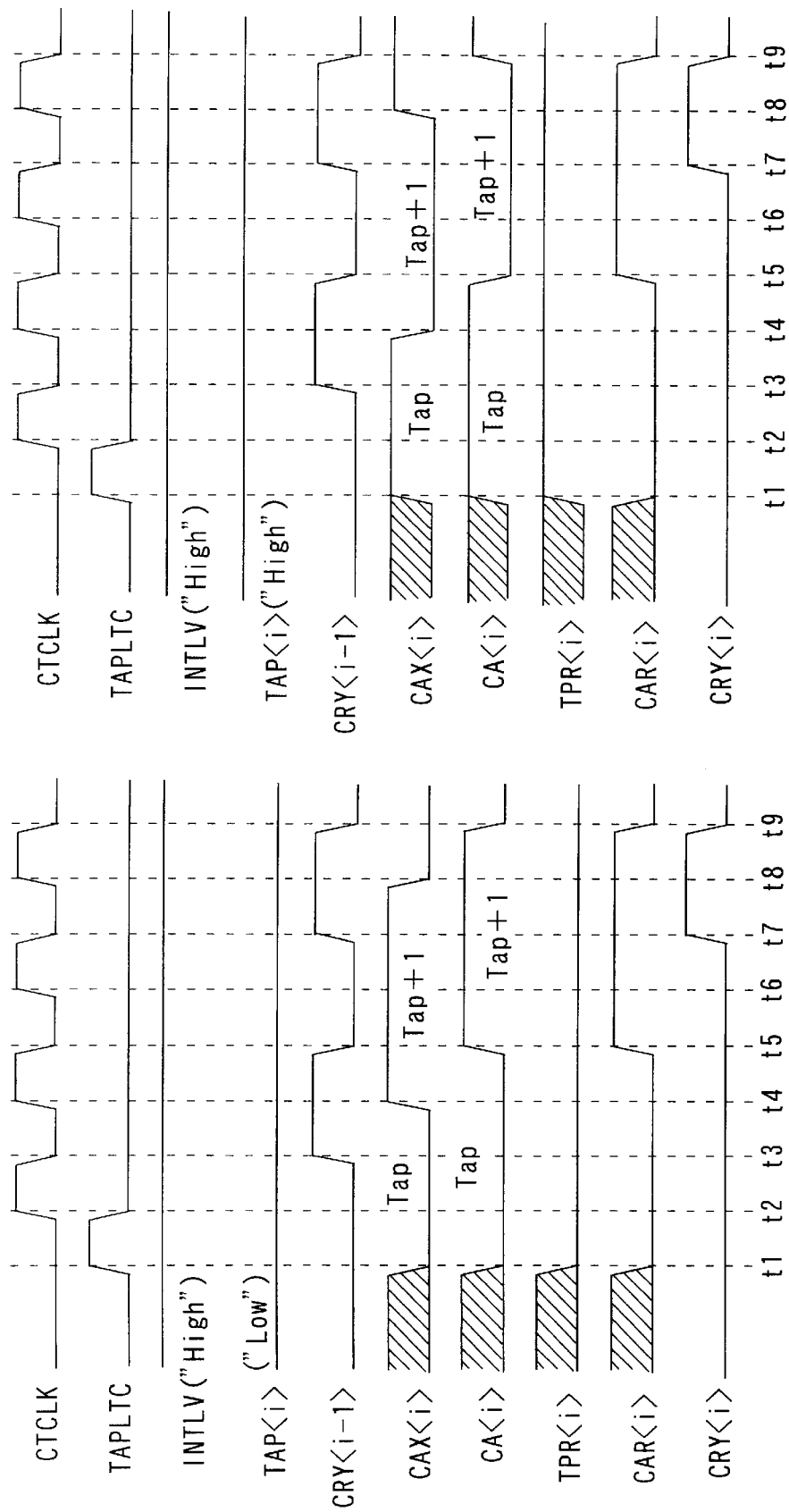
FIG. 10A is a timing chart when TAP<i> is "0," which shows the operation of the counters in the interleave mode.
FIG. 10B is a timing chart when TAP<i> is "1," which shows the operation of the counters in the interleave mode.

As described above, use of the configuration of the counters as shown in FIG. 12 reduces the number of counters to n, even when two-bit prefetching is used. This means that the number of counters is reduced to half the number of counters, 2×n, in the configuration of FIG. 5. Moreover, as compared with the number of counters, n+1, in a conventional semiconductor memory device without prefetching shown in FIG. 1, the number of counters is decreased by one. If the number of bits is small, a decrease in the circuit area as a result of removing a one-bit counter is more effective than an increase in the chip area as a result of providing adders 52-1 to 52-n.

Consequently, the chip area can be decreased by suppressing an increase in the number of address counters or the circuit area. Use of prefetching enables a synchronous memory device to be constructed which can cope with a high-frequency basic clock or high-speed data accessing according to DDR specifications, operates at high speed, and is excellent in its operating characteristics.

[Second Embodiment]

Figure 16:
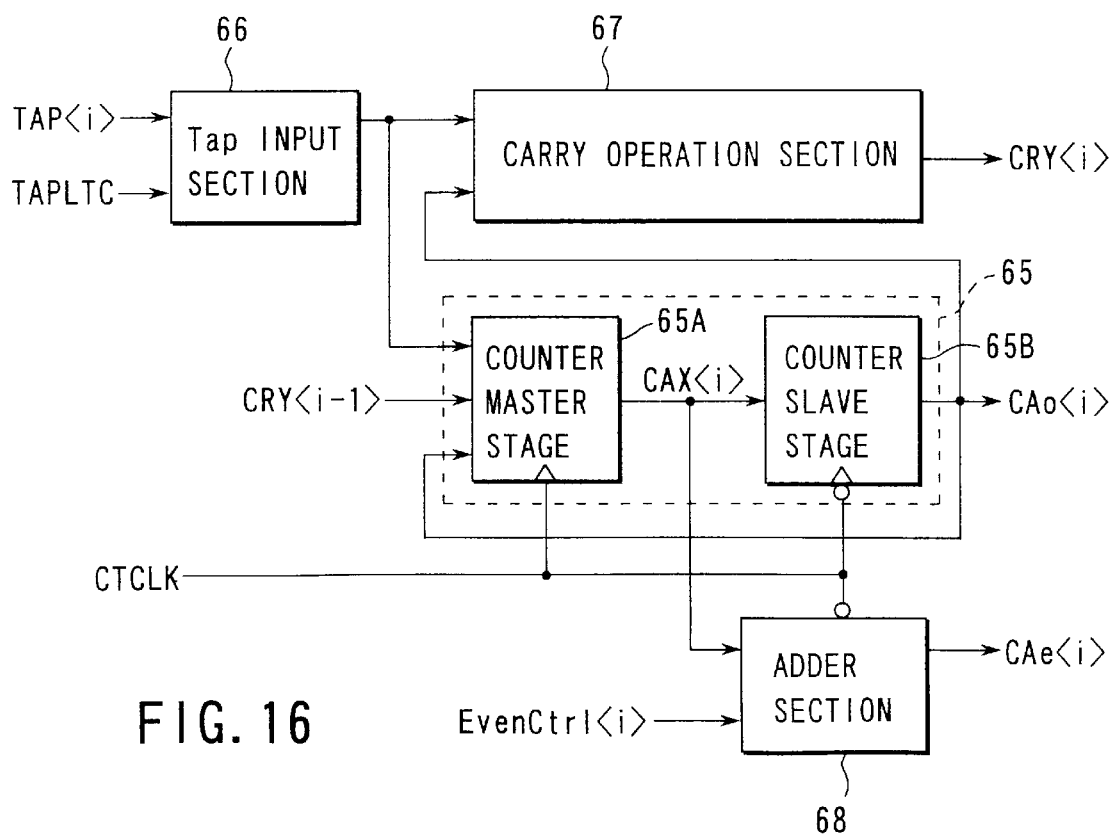
FIG. 16 is a block diagram of one bit of an address counter in a synchronous memory device using prefetching techniques, which helps explain a synchronous memory device according to a second embodiment of the present invention.

FIG. 16 is a block diagram of one bit of an address counter in a semiconductor memory device using prefetching techniques, which helps explain a synchronous memory device according to a second embodiment of the present invention. In the first embodiment of FIG. 12, since an even address is created by causing an odd counter address to pass through an adder, there is a time difference between the time when the odd address is determined with the timing of the falling of the clock signal CTCLK and the time when the even address is determined thereafter. This might make timing design difficult at the address decoder section to which the addresses are inputted. To overcome this drawback, a circuit shown in FIG. 16 is such that the signal at the output node CAX<i> of a master stage 65A in a counter section 65 is inputted to an adder section 68, which performs addition during the time when clock signal CTCLK is high and outputs CAo<n> and CAe<n>, an even and an odd counter address, simultaneously at the falling of the clock signal CTCLK.

Specifically, the one-bit counter includes a counter section 65, a Tap input section 66, a carry operation section 67, and an adder section 68. Start address TAP<i> and signal TAPLTC are externally supplied to the Tap input section 66 in such a manner that the timing with which start address TAP<i> is loaded into the counter is controlled by signal TAPLTC. The counter section 65 is of the master-slave type and is composed of a master stage 65A and a slave stage 65B to which the output signal of the master stage 65A is supplied. Supplied to the master stage 65A are the output signal of the Tap input section 66, the carry signal CRY<i-1> from the counter at the preceding stage, and odd address CAo<i> outputted from the slave stage 65B. In the counter section 65, clock signal CTCLK is supplied to the master stage 65A and the inversion of the clock signal CTCLK is supplied to the slave stage 65B, thereby incrementing the count value. The output signal of the master stage 65A and the output EvenCtrl<i> of the adder control circuit are supplied to the adder section 68, which operates in response to the inverted signal of clock signal CTCLK. In response to the output EvenCtrl<i> of the adder control circuit, the adder section 68 performs addition on the output of the master stage 65A, thereby producing even address CAe<i>. The output signal of the Tap input section 66 and odd address CAo<i> outputted from the slave stage 65B in the counter section 65 are supplied to the carry operation section 67, which generates a carry signal CRY<i> for controlling the counting up of the next stage.

Figure 17:
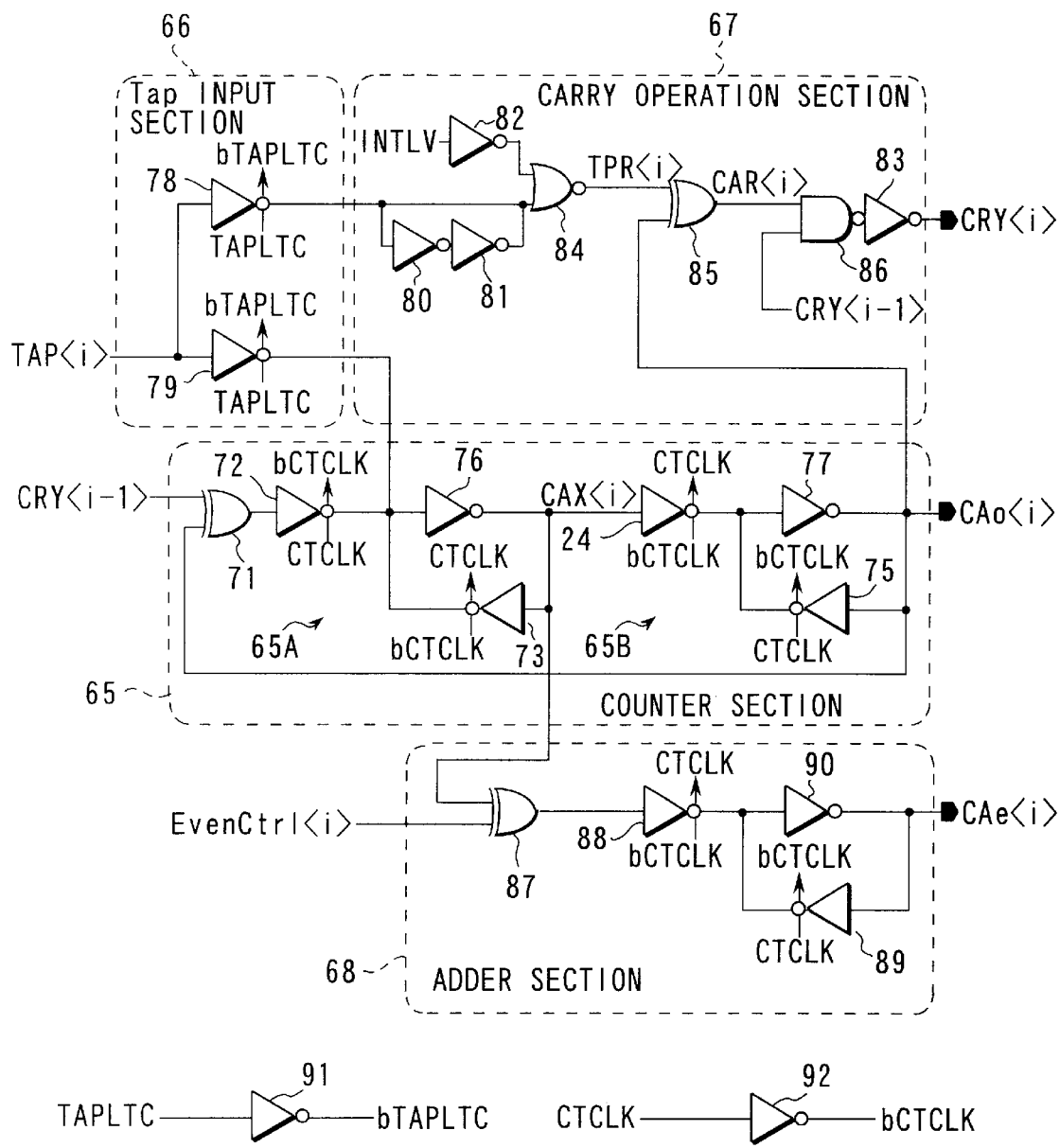
FIG. 17 is a circuit diagram showing an example of the configuration of the address counter shown in FIG. 16.

FIG. 17 is a circuit diagram showing a concrete example of the configuration of the one-bit counter shown in FIG. 16. The counter section 65 includes an exclusive OR gate 71, clocked inverters 72 to 75, and inverters 76, 77. Carry signal CRY<i-1> at the preceding stage is supplied to one input terminal of the exclusive OR gate 71. The output signal of the exclusive OR gate 71 is supplied to the input terminal of the clocked inverter 72. The operation of the clocked inverter 72 is controlled by clock signal CTCLK and its inverted signal bCTCLK to increment the counter. The output signal of the clocked inverter 72 is supplied to the input terminal of the inverter 76. The output signal (CAX<i>) of the inverter 76 is supplied to each of the input terminals of the clocked inverters 73, 74 and one input terminal of the exclusive OR gate 87 in the adder section 68. The operation of each of the clocked inverters 73, 74 is controlled by the clock signals CTCLK, bCTCLK. The output signal of the clocked inverter 73 is supplied to the input terminal of the inverter 76. The output signal of the clocked inverter 77 is supplied to the input terminal of the inverter 77. The output signal of the inverter 77 is not only supplied to each of the input terminal of the inverter 77, the other input terminal of the exclusive OR gate 71 and one input terminal of the exclusive OR gate 85 in the carry operation section 67 but also outputted as odd address CAo<i>. The operation of the clocked inverter 75 is controlled by the clock signals bCTCLK and CTCLK. The output signal of the clocked inverter 75 is supplied to the input terminal of the inverter 77.

The exclusive OR gate 71, clocked inverters 72, 73, and inverter 76 constitute the master stage 65A. The clocked inverters 74, 75, and inverter 77 constitute the slave stage 65B. The data is latched in the master stage 65A in synchronization with the clock signals bCTCLK and CTCLK. This latched data is then latched in the slave stage 65B in synchronization with the clock signals bCTCLK and CTCLK in the next cycle.

The Tap input section 66 is composed of clocked inverters 78 and 79 controlled by the clock signals bCTCLK and CTCLK. The i-th bit TAP<i> in the start address is supplied to the input terminals of the clocked inverters 78 and 79. The output signal of the clocked inverter 78 is supplied to the input terminal of the inverter 80 and one input terminal of the NOR gate 84 in the carry operation section 67. The output signal of the clocked inverter 79 is supplied to the input terminal of the inverter 76 in the counter section 65.

The carry operation section 67 includes inverters 80 to 83, a NOR gate 84, an exclusive OR gate 85, and a NAND gate 86. The output signal of the inverter 80 is supplied to the input terminal of the inverter 81. The output signal of the inverter 81 is supplied to one input terminal of the NOR gate 84. The output signal of the inverter 82 to which signal INTLV indicating the addressing mode is inputted is supplied to the other input terminal of the NOR gage 84. The output signal (TPR<i>) of the NOR gate 84 is supplied to the other input terminal of the exclusive OR gate 85. The output signal (CAR<i>) of the exclusive OR gate 85 is supplied to one input terminal of the NAND gate 86. Carry signal CRY<i–1> at the preceding stage is supplied to the other input terminal of the NAND gate 86. The output of the NAND gate 86 is supplied to the inverter 83. Then, the inverter 83 outputs carry signal CRY<i>.

The adder section 68 includes an exclusive OR gate 87, clocked inverters 88, 89, and an inverter 90. Even control signal EvenCtrl<i> is supplied to the other input terminal of the exclusive OR gate 87. The output signal of the exclusive OR gate 86 is supplied to the input terminal of the clocked inverter 88. The operation of the clocked inverter 88 is controlled by the clock signals CTCLK, bCTCLK. The output signal of the clocked inverter 88 is inputted to the input terminal of the inverter 90. The output signal of the inverter 90 is not only supplied to the input terminal of the clocked inverter 89 but also outputted as even address CAe<i>. The operation of the clocked inverter 89 is controlled by the clock signals bCTCLK, CTCLK. The output signal of the clocked inverter 89 is supplied to the input terminal of the inverter 90.

Furthermore, there are provided inverters 91 and 92. Signal TAPLTC is supplied to the inverter 91, which generates its inverted signal bTAPLTC. Clock signal CTCLK is supplied to the inverter 92, which generates its inverted signal bCTCLK.

With this configuration, because the counting up can be ended during the time when the clock signal is high, or the waiting time, the even and odd counter addresses can be switched simultaneously at the instant that the clock signal goes low, not only the operation speed can be stepped up, but also the timing design of the address decoder section for receiving the output signal of the address counter becomes easier.

Figure 18:
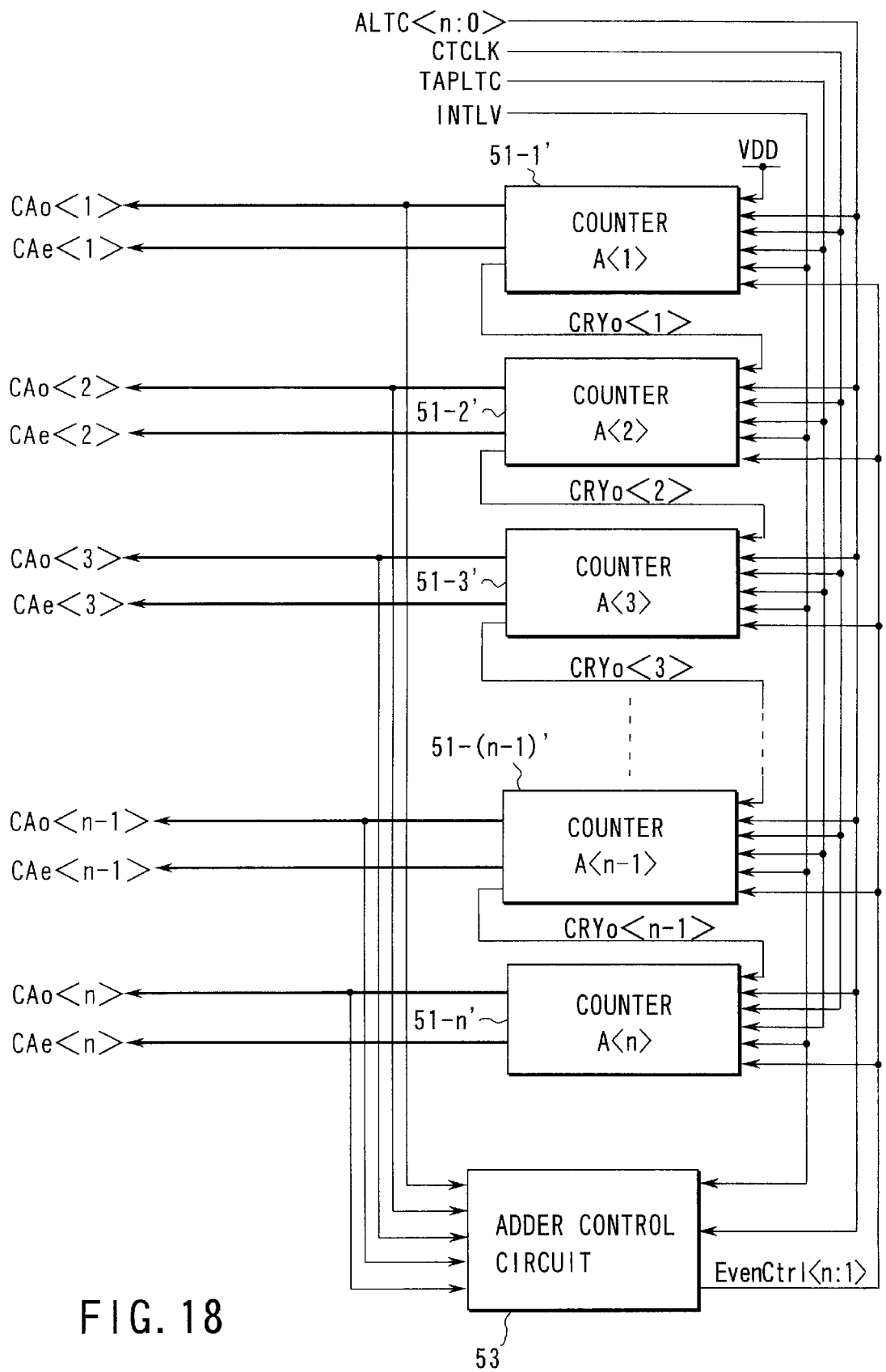
FIG. 18 is a circuit diagram showing an example of the configuration of a two-bit prefetch counter composed of address counters of FIG. 17, which helps explain the synchronous memory device according to the second embodiment.

FIG. 18 shows an overall configuration of a two-bit prefetch address counter using an n number of units of the counter shown in FIG. 17. The basic configuration is roughly the same as that of the circuit of FIG. 12 except that adder control signal EvenCtrl<n:1> is inputted to the counters 51-1' to 51-n' because an adder is incorporated into the inside of each of the counters 51-1' to 51-n' and that the even address generated by the adder in each counter is taken out as the output of the counter. Use of such a configuration makes it possible not only to suppress the number of counters even in two-bit prefetching but also to construct an address counter system with the same output timing of an even address as that of an odd address.

Figure 19:
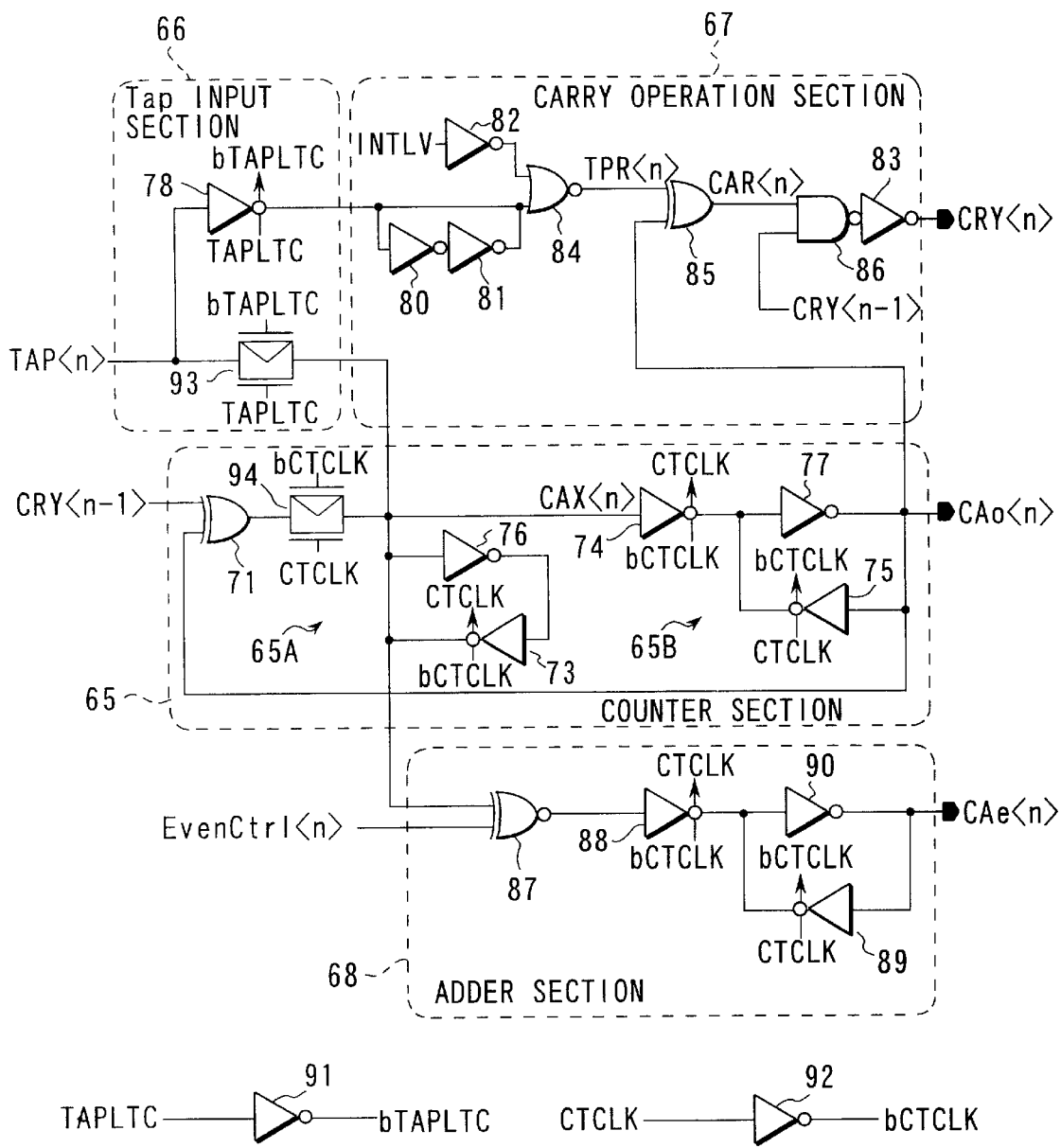
FIG. 19 is a circuit diagram showing another example of the configuration of the address counter shown in FIG. 17.

FIG. 19 is a circuit diagram showing another configuration of the address counter shown in FIG. 17. In the circuit of FIG. 19, the clocked inverter 79 in the Tap input section 66 in the circuit of FIG. 17 is replaced with a CMOS transfer gate 93 and the clocked inverter 72 in the counter section 65 is replaced with a CMOS transfer gate 94. In addition, while the signal at the output node CAX<i> of the master stage 65A has been taken out from the output terminal of the inverter 76, it is taken out from the input terminal of the inverter 76 in FIG. 19. Similarly, while the signal to be outputted to the adder section 68 has been taken out from the output terminal of the inverter 76, it is taken out from the input terminal of the inverter 76 in FIG. 19.

With such a configuration, the number of stages of logic gates present in the path between the time when clock signal CTCLK rises and the time when the output signal CAX<i> of the master stage 65A is switched is reduced, thereby decreasing the gate delay time caused by that part. Specifically, while in the circuit of FIG. 17, the logic gates present in the path are two stages of the clocked inverters 72 and 76, only one stage of the CMOS transfer gate 94 is present in the path. As a result, the time required to count up after clock signal CTCLK has risen is shortened, making it possible to cope with clock signal CTCLK of higher frequency.

As described above, use of the configuration of FIG. 12 according to the first embodiment makes it possible not only to use prefetching techniques to cope with a high-frequency basic clock and high-speed data accessing according to DDR specifications but also to suppress the resulting increase in the number of address counters and the circuit area to the same level as or lower than when no prefetching is used.

Furthermore, use of the configuration of FIG. 18 according to the second embodiment makes it possible to output the simultaneously created prefetch addresses with the same timing in synchronization with the basic clock, facilitating the timing design of an address decoder that receives the addresses.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A synchronous memory device with a prefetch address counter for accessing data items in a single cycle, said address counter comprising:

an n number of one-bit counter circuits to each of which a start address supplied simultaneously with a read command, a clock signal for incrementing a count value, a signal for transferring said start address to an inside of the counter, and a signal indicating an addressing mode are supplied, and a first stage of which counts up in each cycle, thereby causing a carry signal to be inputted to following stages;

an adder control circuit to which an addressing mode signal indicating a state of the addressing mode and outputs of said n one-bit counter circuits are supplied and which senses that the addressing mode is a sequential mode and said start address is an odd address and generates an even control signal for each bit; and an n number of adders which are provided so as to correspond to said one-bit counter circuits and which, according to a state of the even control signal outputted from said adder control circuit, invert an address outputted from each of said one-bit counter circuits when the addressing mode is the sequential mode and said start address is the odd address, but otherwise output the same signal as the address outputted from each of said one-bit counter circuits, wherein said n one-bit counter circuits and said n adders output n-bit addresses.

2. The synchronous memory device according to claim 1, wherein each of said n adders performs addition when said clock signal is at a first logic level and outputs an address when said first logic level is inverted to a second logic level.

3. The synchronous memory device according to claim 1, wherein each of said n adders includes a first transfer gate to one end of which the odd address is supplied and which is controlled by the even control signal outputted from said adder control circuit and a second transfer gate to one end of which an inverted signal of said odd address is supplied, another end of which is connected to another end of said first transfer gate, and which is controlled by the even control signal outputted from said adder control circuit in such a manner that it turns off when said first transfer gate turns on and turns on when said first transfer gate turns off.

4. The synchronous memory device according to claim 1, wherein each of said n adders includes an exclusive OR gate having a first input terminal to which the odd address is supplied, having a second input terminal to which the even control signal outputted from said adder control circuit is supplied, and which outputs an even address at its output terminal.

5. The synchronous memory device according to claim 1, wherein each of said n one-bit counter circuits is of a master-slave type having a master stage and a slave stage, an output of said master stage being supplied to a corresponding one of said n adders, said n one-bit counter circuits transfer a result of counting up to the output of the master stage during a time when said clock signal is at a first logic level and causes the slave stage to output an address when the first logic level is inverted to a second logic level, and said n adders perform addition on the output of the master stage of said n one-bit counter circuits during the time when said clock signal is at the first logic level and output an address when the first logic level is inverted to the second logic level.

6. The synchronous memory device according to claim 1, wherein each of said n one-bit counters includes a Tap input section to which said start address and a signal for loading said start address into the inside of the counter are externally supplied, a counter section which is controlled by a first clock signal and a second clock signal opposite to each other in phase for incrementing the counter and which has a master stage and a slave stage receiving an output signal from said master stage, with an output signal of said Tap input section, a carry signal from a counter at a preceding stage, and an odd address outputted from said slave stage being supplied to said master stage, an adder section to which the output signal of said master stage and the even control signal outputted from said adder control circuit are supplied and which operates in response to said second clock signal, and creates an even address by performing addition on an output of said master stage according to said even control signal, and a carry operation section to which the output signal of said Tap input section and the odd address outputted from said slave stage are supplied and which generates the carry signal for controlling the counting up of the following stage.

7. The synchronous memory device according to claim 6, wherein said Tap input section includes a first clocked inverter and a second clocked inverter, each having an input terminal to which said start address is inputted and each having a clock input terminal to which said signal for loading said start address into the inside of the counter is supplied.

8. The synchronous memory device according to claim 7, wherein the master stage of said counter section includes an exclusive OR gate to a first input terminal to which the carry signal from the counter at the preceding stage is supplied and having a second input to which an output signal of the slave stage is supplied, a third clocked inverter whose input terminal is connected to an output terminal of said exclusive OR gate and having a clocked input terminal to which said first clock signal is supplied, a first inverter whose input terminal is connected to an output terminal of said third clocked inverter and an output terminal of said second clocked inverter, and a fourth clocked inverter whose input terminal is connected to an output terminal of said first inverter, whose output terminal is connected to the input terminal of said first inverter, and having a clocked input terminal to which said second clock signal is supplied, and wherein an output signal of said first inverter is being supplied as the output signal of the master stage to said adder section.

9. The synchronous memory device according to claim 8, wherein the slave stage of said counter section includes a fourth clocked inverter whose input terminal is connected to the output terminal of said first inverter and having a clock input terminal of which said second clock signal is supplied, a second inverter whose input terminal is connected to an output terminal of said fourth clocked inverter, and a fifth clocked inverter whose input terminal is connected to an output terminal of said second inverter, whose output terminal is connected to the input terminal of said second inverter, and having a clocked input terminal to which said first clock signal is supplied, and wherein an output signal of said second inverter is being supplied as an output of the slave stage not only to said carry operation section but also to a second input terminal of said exclusive OR gate.

10. The synchronous memory device according to claim 6, wherein said Tap input section includes a clocked inverter having an input to which said start address is inputted and having a clock input terminal to which a signal for loading said start address into the inside of the counter is supplied, and a first transfer gate to one end of which said start address is inputted and which is controlled by said signal for loading said start address into the inside of the counter.

11. The synchronous memory device according to claim 10, wherein the master stage of said counter section includes an exclusive OR gate having a first input terminal to which the carry signal from the counter at the preceding stage is supplied and having a second input terminal to which an output signal of the slave stage is supplied, a second transfer gate one end of which is connected to an output terminal of said exclusive OR gate and which is controlled by said first clock signal, a first inverter whose input terminal is connected to another end of said second transfer gate and another end of said first transfer gate, and a second clocked inverter whose input terminal is connected to an output terminal of said first inverter, whose output terminal is connected to the input terminal of said first inverter, and having a clock input terminal to which said second clock signal is supplied, and wherein an output of said second clocked inverter is being supplied as the output signal of the master stage to said adder section.

12. The synchronous memory device according to claim 11, wherein the slave stage of said counter section includes a third clocked inverter whose input terminal is connected to the other end of said second transfer gate and having a clock input terminal to which said second clock signal is supplied, a second inverter whose input terminal is connected to an output terminal of said third clocked inverter, and a fourth clocked inverter whose input terminal is connected to an output terminal of said second inverter, whose output terminal is connected to the input terminal of said second inverter, and having a clock input terminal to which said first clock signal is supplied, and wherein an output signal of said second inverter is being supplied as the output of the slave stage to not only said carry operation section but also a second input terminal of said exclusive OR gate.

13. The synchronous memory device according to claim 1, wherein said adder control circuit includes a first inverter to which a signal indicating the addressing mode is supplied, an n number of NAND gates to which an output of said first inverter, a signal of a least significant bit in said start address, and an odd counter address are selectively supplied, and an n number of second inverters to which output signals of said n NAND gates are supplied respectively and which output an n-bit even control signal.

14. A synchronous memory device with a prefetch address counter for accessing data items in a single cycle, said address counter comprising:

an n number of one-bit counter circuits to each of which a start address supplied simultaneously with a read command, a clock signal for incrementing a count value, a signal for transferring said start address to an inside of the counter, and a signal indicating an addressing mode are supplied, a first stage of which counts up in each cycle, thereby causing a carry signal to be inputted to following stages, and each of which is of a master-slave type having a master stage and a slave stage and transfers a result of counting up to an output of the master stage during a time when said clock signal is at a first logic level and causes the slave stage to output an address when the first logic level is inverted to a second logic level;

an adder control circuit to which an addressing mode signal indicating a state of the addressing mode and outputs of said n one-bit counter circuits are supplied and which senses that the addressing mode is a sequential mode and said start address is an odd address and generates an even control signal for each bit; and an n number of adders which are provided so as to correspond to said one-bit counter circuits and which, according to a state of the even control signal outputted from said adder control circuit, invert an address outputted from each of said one-bit counter circuits when the addressing mode is the sequential mode and said start address is the odd address, but otherwise output the same signal as the address outputted from each of said one-bit counter circuits, and further to each of which the corresponding output of the master stage in said n one-bit counter circuits is supplied and which perform addition on the output of the master stage of said n one-bit counter circuits during the time when said clock signal is at the first logic level and output an address when the first logic level is inverted to the second logic level, wherein said n one-bit counter circuits and said n adders output n-bit addresses.

15. An address counter comprising:

an n number of one-bit counter circuits to each of which a start address, a clock signal for incrementing a count value, a signal for transferring said start address to an inside of the counter, and a signal indicating a mode are supplied, a first stage of which counts up in each cycle, thereby causing a carry signal to be following stages, and further each of which is of a master-slave type having a master stage and a slave stage and which transfer a result of counting up to an output of the master stage during a time when said clock signal is at a first logic level and cause the slave stage to output an address when the first logic level is inverted to a second logic level;

an adder control circuit to which a mode signal indicating a state of said mode and outputs of said n one-bit counter circuits are supplied and which senses that a sequential mode is on and said start address is an odd address and generates an even control signal for each bit; and an n number of adders which are provided so as to correspond to said one-bit counter circuits and which, according to a state of the even control signal outputted from said adder control circuit, invert an address outputted from each of said one-bit counter circuits when the sequential mode is on and said start address is the odd address, but otherwise output the same signal as the address outputted from each of said one-bit counter circuits, and further to each of which the corresponding output of the master stage in said n one-bit counter circuits is supplied and which perform addition on the output of the master stage of said n one-bit counter circuits during the time when said clock signal is at the first logic level and output an address when the first logic level is inverted to the second logic level, wherein said n one-bit counter circuits and said n adders output n-bit addresses.

16. The address counter according to claim 15, wherein said start address is supplied simultaneously with a read command in a synchronous memory device.

17. The address counter according to claim 15, wherein said mode signal is an addressing mode signal indicating a state of the addressing mode in a synchronous memory device.

* * * * *

UNITED STATES PATENT AND TRADEMARK OFFICE
CERTIFICATE OF CORRECTION

PATENT NO.   : 6,708,264 B1
DATED        : March 16, 2004
INVENTOR(S)  : Abe et al.

It is certified that error appears in the above-identified patent and that said Letters Patent is hereby corrected as shown below:

Column 18,
Line 13, change "following stage" to -- inputted to following stages --.

Signed and Sealed this

Twenty-second Day of June, 2004

JON W. DUDAS
*Acting Director of the United States Patent and Trademark Office*